United States Patent [19]

Slemmer

[11] Patent Number: 5,053,996
[45] Date of Patent: Oct. 1, 1991

[54] DUAL STATE MEMORY STORAGE CELL WITH IMPROVED DATA TRANSFER CIRCUITRY

[75] Inventor: Wiliam C. Slemmer, Dallas, Tex.

[73] Assignee: SGS-Thomson Microelectronics, Inc., Carrollton, Tex.

[21] Appl. No.: 661,555

[22] Filed: Feb. 26, 1991

[51] Int. Cl.$^5$ ............................................. G11C 11/412
[52] U.S. Cl. .................................. 365/156; 365/190; 365/205; 365/208
[58] Field of Search ............... 365/154, 156, 190, 205, 365/207, 208, 198

[56] References Cited

U.S. PATENT DOCUMENTS 4,873,665 10/1989 Jiang et al. ......................... 365/156

FOREIGN PATENT DOCUMENTS 62-291168 12/1987 Japan .................................. 365/154

Primary Examiner—Joseph E. Clawson, Jr.
Attorney, Agent, or Firm—Rodney A. Anderson; Richard K. Robinson; Lisa K. Jorgenson

[57] ABSTRACT

A dual storage cell is disclosed, which utilizes memory cells of cross-coupled inverters together with isolation transistors coupled between the driver transistors of the inverters and the reference supply node. Transfer circuitry is included in the dual storage cell, which couples one of the data nodes of the destination memory cell to a power supply node responsive to a transfer enable signal, and responsive to the data state of the source memory cell. During the transfer operation, the isolation transistors in the destination cell are turned off so that the cross-coupled inverters are not biased to the reference supply node. This allows the data transfer to occur without a DC current path between the power supply node and the reference supply node. The preferred implementation uses complementary transistors for the isolation transistors relative to the transfer devices, and to connect the gates together to the transfer enable signal. Either single or dual isolation transistors may be used in the memory cell, depending on layout constraints.

20 Claims, 2 Drawing Sheets

DUAL STATE MEMORY STORAGE CELL WITH IMPROVED DATA TRANSFER CIRCUITRY

This invention is in the field of integrated circuit memories, and is more particularly directed to dual storage cell memories.

BACKGROUND OF THE INVENTION

In many modern data processing systems, a useful memory function may be provided by dual storage cell memories. Dual storage cell memories, whether provided as a stand-alone memory or integrated into a logic device such as a timer, microcontroller, microprocessor, or customized logic device (e.g., an ASIC), provide two memory cells for each addressable location, each of which can be independently and asynchronously accessed, relative to the other. In addition, such memories have the function where the contents of one memory cell can be transferred to the other storage memory cell at the same address, without requiring the performing of successive read and write operations upon the two locations.

An example of a conventional dual storage cell 2 is illustrated in FIG. 1, which is similar to that described in U.S. Pat. No. 4,873,665. Referring to FIG. 1, dual storage cell 2 consists of two CMOS six-transistor static memory cells T and U, configured as cross-coupled inverters as is well known in the art. For purposes of explanation herein, memory cell T has data nodes TT (true) and TC (complement) which are coupled to bit lines TB and TB_, respectively, by way of pass gates controlled by enable line TE. Similarly, memory cell U has data nodes UT (true) and UC (complement) coupled to bit lines UB and UB_ by way of pass gates controlled by enable line UE. For ease of transfer of data states, it should be noted that the polarity convention of the arrangement of FIG. 1 is such that opposite bit lines (e.g., TB and UB_) are on the same side of dual storage cell 2, with their complements (TB_ and UB) on the other side thereof.

Transfer circuitry is provided in this prior dual storage cell 2 by way of series n-channel transistor pairs, each pair coupled between a data node and ground. The gate of one of the n-channel transistor pairs is controlled by the data node of the source memory cell (i.e., the cell from which data is being transferred); the gate of the other of the n-channel transistor in the pair is controlled by a transfer signal line, either U>T or T>U, depending upon the direction of the transfer. For example, referring to the transfer circuitry associated with data node TT of memory cell T, n-channel transistors 6 and 8 have their source-drain paths coupled in series between data node TT and ground. Transistor 6 has its gate coupled to data node UC, and transistor 8 has its gate coupled to signal line U>T.

In operation, as described in the above-cited U.S. Pat. No. 4,873,665, the data state of memory cell U may be transferred to memory cell T by the enabling of line U>T to a high logic level (enable, or word line, signals UE and TE are preferably at a low logic level during this time). For the example where cell U is storing a "0" (i.e., data node UC is high) and cell T is storing a "1" (i.e., data node TT is high), both of transistors 6 and 8 will be on, to pull data node TT low and effect the transfer; during this time, since data node UT is low, the series n-channel transistor pair connected between node TC and ground is open. However, until such time as the state of memory cell T switches (i.e., until node TC is pulled high by the p-channel transistor with its gate connected node TT, which is being pulled low), p-channel transistor 4 will remain on. The series connection of p-channel transistor 4 and n-channel transistors 6 and 8, all of which are on, provide a DC current path between $V_{cc}$ and ground during this portion of the data transfer from cell U to cell T. The current drawn by such a path is similar to that required during an SRAM write operation, which is quite significant as is well known. It should be noted that the transfer operation preferably is performed simultaneously for a number of dual storage cells 2, generally those associated with the same byte or word address value, or a group of words which are simultaneously transferred.

As data processing systems, particularly those utilizing modern microprocessors, continue to use wider data busses (32-bit busses now being commonplace), the other components in the system also preferably operate with data words of similar size. The transfer operation described hereinabove relative to dual storage cell 2 of FIG. 1 thus is preferably performed for the number of dual storage cells 2 corresponding to the size of the data word, or to the number of bits in the several data words which are simultaneously transferred, if such is the case. However, for dual storage cell 2 described hereinabove, the DC current path between $V_{cc}$ and ground will, in the worst case, be simultaneously present for the number of dual storage cells 2 on the same transfer signal line. Particularly with thirty-two-bit, or wider, data words, and hence thirty-two bit or more simultaneous dual storage cell transfers, a memory incorporating dual storage cells 2 can present a significant current spike. As is well known in the art, large current spikes not only dissipate power in the system, but can also generate Ldi/dt noise in the system capable of upsetting the operation of other circuits in the system.

It is therefore an object of this invention to provide a dual storage cell having data transfer circuitry which draws reduced current.

It is a further object of this invention to provide such a dual storage cell which avoids presenting a DC current path between the power supply nodes thereof.

It is a further object of this invention to provide such a dual storage cell which allows for flexible layout in the memory device.

It is a further object of this invention to provide such a dual storage cell which may be used in stand-alone memories, or other integrated circuits, such as logic and microprocessor circuits, having memories embedded therein.

Other objects and advantages of the invention will be apparent to those of ordinary skill in the art having reference to the following specification together with its drawings.

SUMMARY OF THE INVENTION

The invention may be incorporated as a dual storage cell configured as cross-coupled inverters in combination with an isolation transistor, or isolation transistor pair, coupled between the inverters and a reference supply node. The isolation transistors are controlled to be turned off during most, or all, of the transfer operation. For example, the transfer signal which enables data transfer into the destination storage cell may be connected directly to the gates of the isolation transistors and the gates of the transfer devices, where the isolation transistors and transfer devices are complementary to one another. Upon completion of the transfer, the isolation transistors are turned back on, which sets the transferred data state in the destination memory cell. This construction and operation of the dual storage cell allows for rapid data transfer between cells therewithin, without significant DC current being drawn in the cell between the power supply node and the reference supply node.

DETAILED DESCRIPTION OF THE DRAWINGS

DETAILED DESCRIPTION OF THE PREFERRED EMBODIMENT

Figure 2:
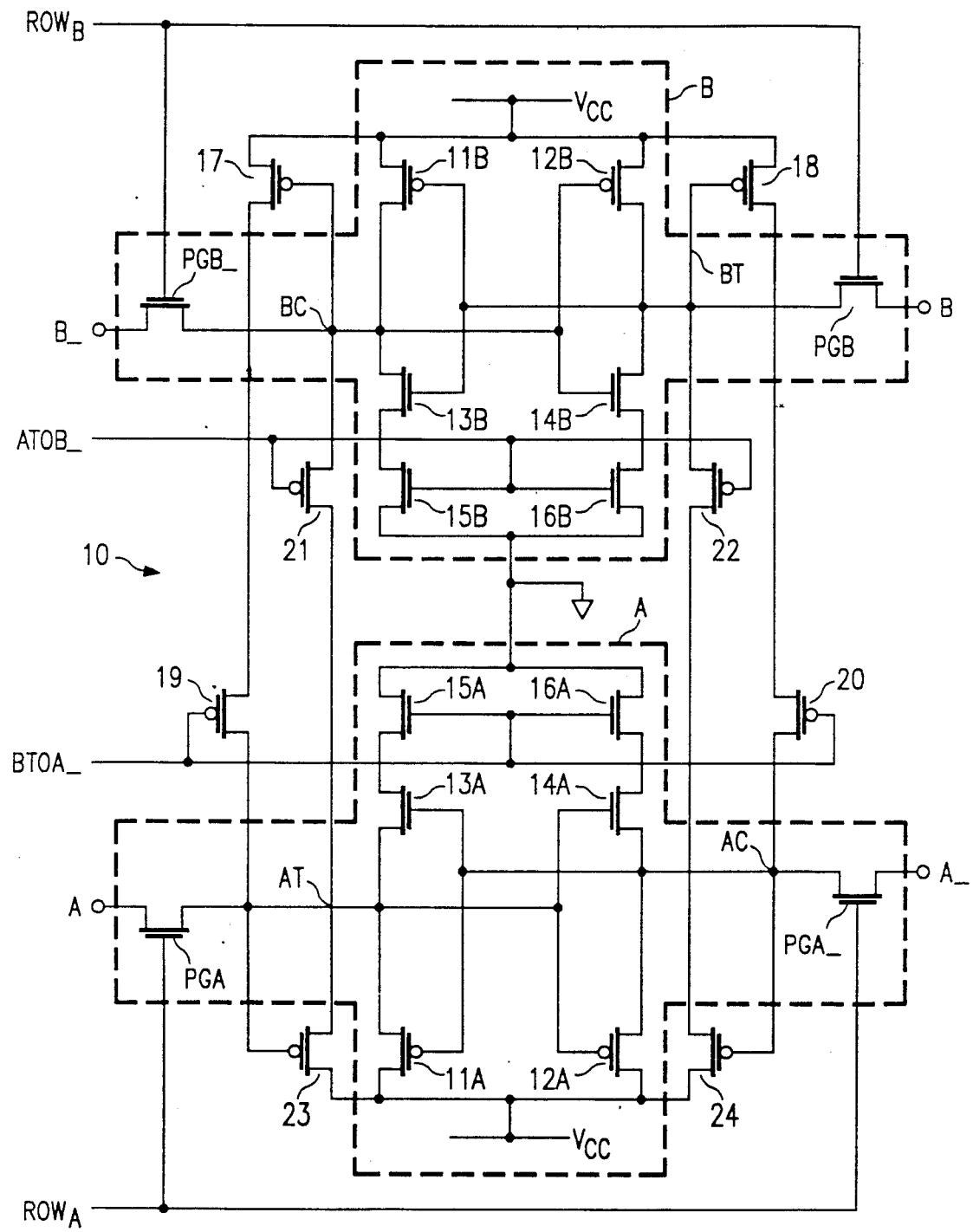
FIG. 2 is an electrical diagram, in schematic form, of a dual storage cell according to the preferred embodiment of the invention.

Referring now to FIG. 2, the preferred embodiment of the invention will now be described in detail. Dual storage cell 10 includes two memory cells A and B. According to this embodiment of the invention, each of memory cells A and B are eight-transistor complementary metal-oxide-semiconductor (CMOS) cells, including cross-coupled inverters as will be described in further detail hereinbelow. Each of memory cells A and B include true and complement data nodes, commonly referred to as the cross-coupled nodes. These nodes are identified in FIG. 2 as true data node AT and complement data node AC for memory cell A, and true data node BT and complement data node BC for memory cell B. In the conventional manner, each of n-channel pass gates PG couple a data node to a bit line responsive to a row line, or word line, signal ROW. In the example of FIG. 2, pass gate PGA couples true data node AT to bit line A, and pass gate PGA_ couples complement data node AC to bit line A_, both responsive to row signal $ROW_A$ being at a high logic level; similarly, responsive to row signal $ROW_B$ being at a high level, pass gate PGB couples true data node BT of memory cell B to bit line B, and pass gate PGB_ couples complement data node BC to bit line B_.

As noted hereinabove, memory cells A and B in dual storage cell 10 are eight-transistors cells; two of the transistors for each cell A and B are the pass gates PG and PG_ for each. Each of memory cells A and B include cross-coupled inverters, as in conventional static random access memory (SRAM) cells. A first inverter in each of memory cells A and B includes p-channel transistor 11 and n-channel transistor 13 having their source-drain paths connected in series, and having their gates in common; the second inverter includes p-channel transistor 12 and n-channel transistor 14 with their source-drain paths connected in series and their gates in common. The sources of p-channel transistors 11 and 12 are connected to power supply node $V_{cc}$. The drains of transistors 11 and 13 are connected to the gates of transistors 12 and 14, and the drains of transistors 12 and 14 are connected to the gates of transistors 11 and 13, in the conventional cross-coupled inverter manner. The data nodes of memory cells A and B refer to these cross-coupled nodes.

According to this embodiment of the invention, however, each of memory cells A and B include additional n-channel transistors 15 and 16. N-channel transistor 15 has its drain connected to the source of n-channel transistor 13, and n-channel transistor 16 has its drain connected to the source of n-channel transistor 14. Each of n-channel transistors 15, 16, in each of memory cells A and B, has its source connected to ground, and its gate connected to the transfer signal line which, when at a low logic level, enables transfer of data into its associated memory cell A, B. For example, in memory cell B, n-channel transistors 15B and 16B each have their gate connected to signal line ATOB_, and in memory cell A, n-channel transistors 15A and 16A each have their gate connected to signal line BTOA_.

As will be described hereinbelow relative to the operation of dual storage cell 10 according to this embodiment of the invention, the gating of transistors 15 and 16 in the destination memory cell with the transfer control signal line provides significant advantages in the reduction of the current. It should be noted, however, that a separate signal for controlling the gates of transistors 15 and 16 could provide further current reduction during the transfer operation, if the layout constraints in the memory array permits.

In this embodiment of the invention, the circuitry in dual storage cell 10 for transferring data between memory cells A and B is implemented as series-connected p-channel transistors. P-channel transistors 17 and 19, which effect transfer of data from memory cell B to memory cell A, have their source-to-drain paths connected in series between $V_{cc}$ (at memory cell B) and true data node AT of memory cell A; the gate of p-channel transistor 17 is controlled by complement data node BC of memory cell B, and the gate of p-channel transistor 19 is controlled by signal line BTOA_. On the other side of dual storage cell 10, p-channel transistors 18 and 20 have their source-to-drain paths connected in series between $V_{cc}$ and complement data node AC of memory cell A; the gate of transistor 18 is connected to true data node BT of memory cell B and the gate of transistor 20 is controlled by signal line BTOA_. For performing data transfer from memory cell A to memory cell B, the source-to-drain paths of p-channel transistors 21 and 23 are connected in series between $V_{cc}$ and complement data node BC of memory cell B, and the source-to-drain paths of p-channel transistors 22 and 24 are connected in series between $V_{cc}$ and true data node BT of memory cell B. The gates of transistors 23 and 24 are controlled by true and complement data nodes AT and AC, respectively of memory cell A, and the gates of transistors 21 and 22 are controlled by signal line ATOB_.

It is contemplated that the various control signals (i.e., $ROW_A$, $ROW_B$, ATOB_, and BTOA_) can be readily implemented by timing and control circuitry in the device containing dual storage cell 10, in the conventional manner. Implementation of the necessary sense amplifiers and write circuits for reading data from and writing data to dual storage cell 10 via bit lines A, A_, B, B_, is also contemplated to be within the level of ordinary skill in the art, using conventional circuits and techniques according to the desired memory function.

In normal operation (i.e., read and write operations other than transfers between memory cells A and B), lines ATOB_ and BTOA_ are held at a high logic level. In this condition, the series transistor paths between memory cells A and B are all disabled (i.e., are open circuits). Accordingly, in the absence of a transfer operation, the access (whether read or write) of memory cells A and B may be effected independently and asynchronously from one another, in the conventional manner, by enabling row lines ROW according to the desired row address value, responsive to which the selected pass gates PG connect their associated memory cells to the bit lines associated therewith. For example, a row decoder may generate a high logic level on row line signal ROW$_B$, responsive to which data node BC will be coupled to bit line B_ by pass gate PGB_, and data node BT will be coupled to bit line B by pass gate PGB. With pass gates PGB and PGB_ on, reading of the contents of, or writing of data to, bit lines B and B_, and thus from or to memory cell B, is effected. It should be noted that multiple ones of dual storage cells 10 are incorporated into the memory, arranged in rows and columns in the conventional manner to provide a dual storage cell memory of the desired size.

Dual storage cell 10, with independently accessible memory cells A and B therein, is thus particularly useful in certain components and parts of components in data processing systems. A first example of a circuit advantageously utilizing dual storage cell 10 is a shared memory for data communication between asynchronously operating processors or other circuits. In a shared memory communication system, each of two processors may write data into one of the dual storage cells; for example, one processor may access memory cells A, while another may access memory cells B. Communication of data is accomplished by the writing of data by one processor into the memory, for example to multiple memory cells A. Transfer of the contents of one or more memory cells A to the memory cells B in the same dual storage cells 10, and reading of the memory cells B by the other processor in the system retrieves the communicated data from the first processor, in an asynchronous manner.

Another example of a circuit which may advantageously utilize dual storage cell 10 is a timer, where one of the memory cells in each dual storage cell 10 stores a timekeeping value, with the other of the memory cells in each dual storage cell 10 being user-accessible. The use of dual storage cell 10 in such timers is preferred so that the stored attributes such as current time, alarm times, event times, and status bits (timer on, alarm on, etc.), may be updated without upsetting the timed operation. For example, a dual storage cell timer allows for one of the memory cells in dual storage cells 10 to receive updated information, while the other of the memory cells in dual storage cells 10 can be accessed asynchronously and independently from the updating operation. Transfer of the updated contents from the receiving memory cells to the accessible memory cells can be synchronized to an appropriate time interval, thus preventing errors which can occur as a result of simultaneous, and conflicting, updating and accessing.

The transfer operation between memory cells A and B will now be described in detail. As noted hereinabove in the description of the construction of dual storage cell 10 of FIG. 2, each of the four data nodes (AT, AC, BT, BC) in dual storage cell 10 may be connected to $V_{cc}$ by way of a pair of p-channel transistors having their source-drain paths connected in series. In each series p-channel transistor pair, the gate of one of the transistors is coupled to a control signal line (ATOB_ or BTOA_, as the case may be), while the other is coupled to a data node of the source memory cell (i.e., the cell from which data is being transferred). As is apparent from FIG. 2, it is convenient to have the true and complement data nodes of memory cell A control the pulling-up of the complement and true data nodes of memory cell B, and vice versa.

As a result of this connection, only one of the series p-channel transistor pairs will have both of its transistors on in any transfer cycle, namely the transistor pair which is associated with the desired direction of transfer and which is associated with the lower voltage data node of the source memory cell. For example, if a transfer is to take place from memory cell A of dual storage cell 10 to memory cell B, and if the data state of memory cell A is a "1" (i.e., complementary data node AC is low), p-channel transistors 22 and 24 will both be in their on-state, and true data node BT of memory cell B will be coupled to $V_{cc}$ therethrough. All other series p-channel transistor pairs in dual storage cell 10 will have at least one transistor off, and as such will not be involved in the transfer operation. It should be noted that all row lines ROW are preferably turned off (i.e., are at a low logic level) during a transfer operation.

It should also be noted that if the stored data state of memory cell B is already at a "1" (i.e., true data node BT is already at a high logic level), there will be no change in state of memory cell B, with no significant current drawn, or power dissipated, in such an operation.

Figure 3:
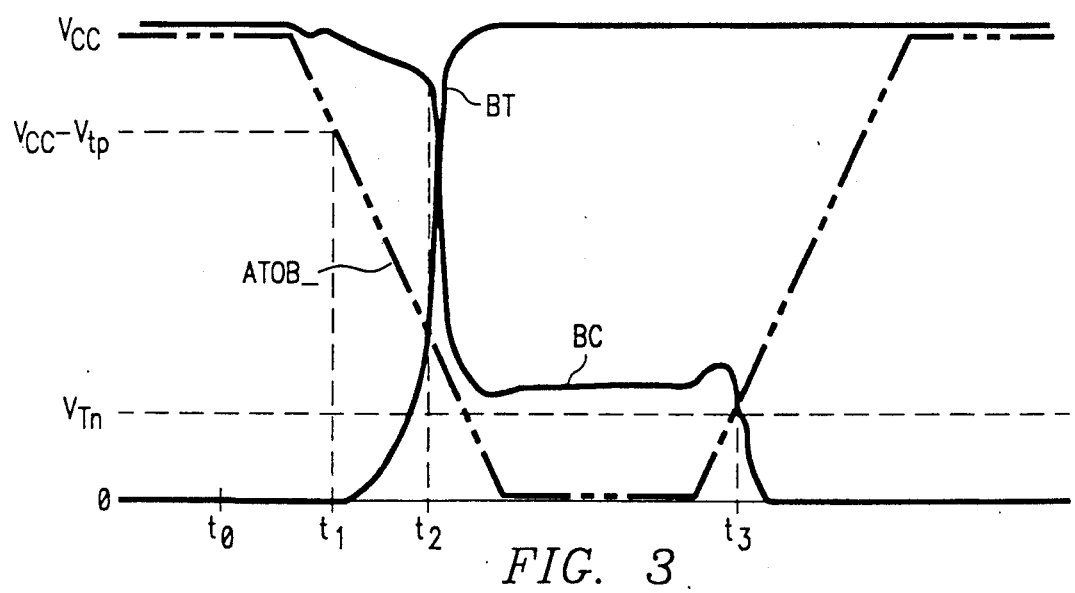
FIG. 3 is a timing diagram, illustrating the operation of the dual storage cell of FIG. 2.

Referring now to FIG. 3, the operation of dual storage cell 10 according to this embodiment of the invention will now be described, relative to a transfer cycle where the memory cell to which data is being transferred must change its data state. In this example (similarly to the example of FIG. 1 discussed hereinabove), the transfer operation will transfer a "1" state from memory cell A to memory cell B, with memory cell B initially storing a "0". Accordingly, the initial condition of memory cell A has complement data node AC at a low logic level and true data node AT high, and the initial condition of memory cell B (shown in FIG. 3 at $t = t_0$) has true data node BT low and complement data node BC is high. From prior to initiation of the transfer operation and for its duration, row line signals ROW$_A$ and ROW$_B$ (neither shown in FIG. 3) remain at a low logic level so that memory cells A and B are isolated from the bit lines. Also at the beginning of the transfer operation, signal line ATOB_ is at a high logic level; signal line BTOA_ (not shown in the example of FIG. 3) is at a high logic level and will remain so throughout the transfer operation from memory cell A to memory cell B.

As shown in FIG. 3, at time $t_0$, complementary data node BC B is at or near $V_{cc}$, and true data node BT is at or near ground, due to the operation of the cross-coupled inverters in memory cell B. The transfer operation begins with signal line ATOB_ making a high to low transition. At time $t_1$, signal line ATOB_ has fallen to a p-channel threshold voltage ($V_{tp}$) below $V_{cc}$, turning transistor 22 on. Since transistor 24 is also on (complementary data node AC of memory cell A being at a low logic level), true data node BT begins to be pulled toward power supply node $V_{cc}$ through transistors 22 and 24. It should be noted that, even though transistors 21 is also on, transistor 23 remains off since data node AT is at a high logic level.

At and after time $t_2$, when signal line ATOB_ falls toward and below an n-channel threshold voltage ($V_{tn}$), transistors 15B and 16B in memory cell B begin turning off. As transistor 16B turns off, the pulling up of node BT toward $V_{cc}$ can now occur without a DC current path through transistors 24, 22, 14B and 16B. As node BT continues to be charged toward $V_{cc}$, particularly once it crosses the threshold voltage of transistor 13B ($V_{tn}$), the voltage of node BC begins to drop due to charge sharing between transistors 11B and 13B. During this time, a differential voltage is established between node BT and BC, with true data node BT being close to the power supply voltage $V_{cc}$. It should be noted that, once transistors 15B and 16B are turned off by line ATOB_ in this embodiment of the invention, the transition of nodes BT and BC is accomplished by charging or discharging capacitive loads only, with no DC current path, since node BC is floating, and since node BT is connected only to $V_{cc}$ via the charging path.

After sufficient delay to ensure that a valid differential voltage has been established between nodes BT and BC (such a delay may be readily selected by modeling or other design selection within the skill of one of ordinary skill in the art), line ATOB_ makes a low-to-high transition to effect the end of the transfer operation, thereafter enabling read and write operations. As line ATOB_ crosses the level $V_{tn}$ (shown as time $t_3$ in FIG. 3), transistors 15B and 16B turn on, which drives the lower data node (node BC in this case), to be pulled toward ground through transistors 13B and 15B. As is the case in conventional cross-coupled inverter latches, regenerative feedback causes the full logic level to be quickly reached after transistors 15B and 16B are turned on. As a result, the logic state of memory cell A has been fully transferred to memory cell B in this example of the operation of dual storage cell 10.

Figure 1:
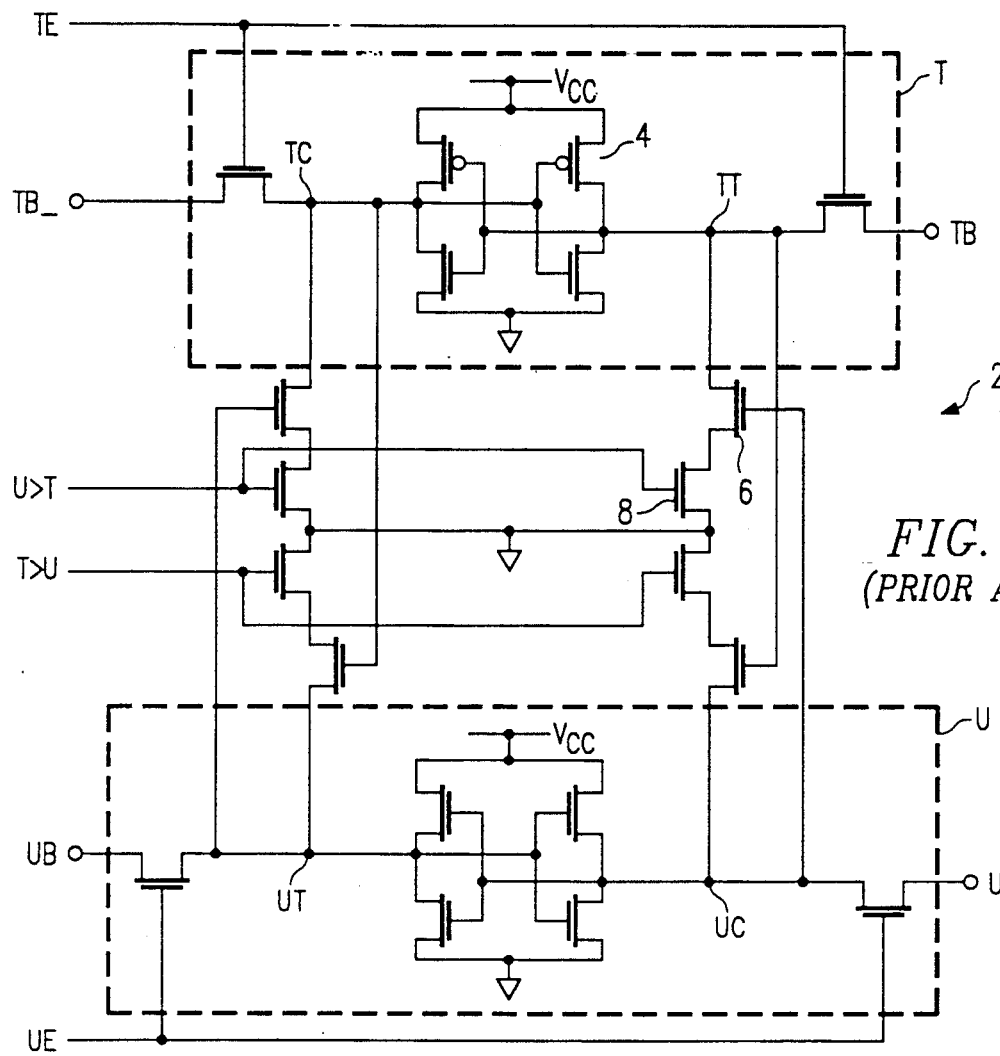
FIG. 1 is an electrical diagram, in schematic form, of a dual storage cell according to the prior art.

It should be noted that the current drawn during the transfer operation in dual storage cell 10 is much reduced over prior dual storage cells, an example of which is described hereinabove relative to FIG. 1. In dual storage cell 10, a DC current path exists only during that portion of the high-to-low transition of the control signal on line ATOB_ at which the signal is between $V_{cc}-V_{tp}$ and $V_{tn}$, i.e., where transistors 24, 22, 14B and 16B are all on. The switching power thus drawn through the switching memory cell is on the order of that drawn by the switching of a CMOS inverter, and thus is quite low. In contrast, referring to the storage cell of FIG. 1, a DC current path exists for so long as the falling data node remains above an n-channel threshold voltage (i.e., the opposing n-channel transistor remains on), which can be on the order of several nanoseconds and may thus include the entire transfer operation cycle.

It should therefore be apparent that dual storage cell 10 according to the preferred embodiment of the invention significantly reduces the current drawn by dual storage cell(s) 10 during a transfer operation to a level approximately that of the switching current spike of a CMOS inverter. In a shared memory, timer, or other dual storage cell memory implementation, the number of dual storage cells to which the transfer operation may be simultaneously done may be much larger than for such components utilizing conventional dual storage cells, since the current spike resulting from such transfers are much reduced. It is therefore contemplated that the present invention allows for more efficient and stable system operation, particularly during operations where a large number of transfers are performed. For example, while only up to eight switching dual storage cells according to the prior art of FIG. 1 may be tolerable, due to the current spike, it is contemplated that 32, 64, or even up to 128, parallel simultaneous transfers may be performed utilizing the dual storage cell according to this embodiment of the invention.

As indicated hereinabove, the gates of transistors 15 and 16 may, alternatively, be controlled by a dedicated control signal thereto. Such control separate from the transfer control signal lines ATOB_ and BTOA_ could further reduce the current drawn from that described hereinabove, since transistors 15 and 16 in the memory cell to which data is being transferred could be turned off prior to turning on the p-channel transistors with the control signal ATOB_ or BTOA_, as the case may be. Such an alternative arrangement could be used to eliminate even the short period of DC current during the transition of the ATOB_ or BTOA_ signal, further limiting the current. Of course, two additional signal lines (one for each memory cell A and B) would be required to implement this arrangement over that shown in FIG. 2.

It should be noted that a further alternative to the configuration of FIG. 2 is the use of a single n-channel transistor connected between ground and the cross-coupled inverters of memory cells A and B, replacing dual transistors 15 and 16. In such a case, the sources of transistors 13 and 14 would be connected together. The particular choice of whether one or two of such n-channel transistors should be used (i.e., whether the memory cells A and B are to be seven-transistor or eight-transistor) is preferably made when faced with the particular layout constraints of the dual storage cell memory, as in some cases two smaller transistors may be advantageous over a single larger transistor, and vice versa.

It should further be noted that the above-described embodiment is directed to a two-way dual storage cell, where data transfers can take place in either direction between the two memory cells. It should also be noted that the invention may be incorporated into a one-way dual storage cell, for example where transfers may only take place between memory cell A and memory cell B. In such an alternative embodiment, memory cell A (i.e., the memory cell to which data would not be transferable) would not need the pull-down n-channel transistor(s) or equivalent, and may thus be formed of the conventional 6-T, 4-T and 2-R, or other, arrangement.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A dual storage cell, comprising:
   a first memory cell, comprising:
   first and second cross-coupled inverters, driving first and second data nodes, respectively; and
   an isolation circuit, having a conduction path coupled between said first and second cross-coupled inverters and a first power supply node, and having a control terminal;
   a second memory cell, comprising:
   first and second cross-coupled inverters, driving first and second data nodes, respectively; and
   a first transfer circuit, comprising:
   a first series circuit coupled between the first data node of said first memory cell and a second power supply node, having a control terminal for receiving a transfer enable signal enabling said first series circuit to couple said second power supply node to said first data node of said first memory cell, responsive to the data state of said second memory cell; and a second series circuit coupled between the second data node of said first memory cell and said second power supply node, having a control terminal for receiving a transfer enable signal enabling said second series circuit to couple said second power supply node to said second data node of said first memory cell, responsive to the data state of said second memory cell;

wherein said control terminal of said isolation circuit is controlled in such a manner as to isolate said first and second cross-coupled inverters from said first power supply node during a portion of the time that said transfer enable signal enables said first and second series circuits.

2. The cell of claim 1, wherein said first series circuit comprises:

first and second series transistors, having their conduction paths connected in series between said first data node of said first memory cell and said second power supply node, said first series transistor having its gate receiving said transfer enable signal, and said second series transistor having its gate coupled to said first data node of said second memory cell;

and wherein said second series circuit comprises:

third and fourth series transistors, having their conduction paths connected in series between said second data node of said first memory cell and said second power supply node, said third series transistor having its gate receiving said transfer enable signal, and said fourth series transistor having its gate coupled to said second data node of said second memory cell.

3. The cell of claim 2, wherein said first, second, third and fourth transistors are field-effect transistors.

4. The cell of claim 3, wherein said isolation circuit comprises:

a fifth field effect transistor, having its source-to-drain path coupled between said first and second cross-coupled inverters and said first power supply node, and having a gate as said control terminal.

5. The cell of claim 4, wherein the gate of said fifth field effect transistor also receives said transfer enable signal in such a manner that said transfer enable signal turns off said fifth field effect transistor and turns on said first and third series transistors in said first transfer circuit.

6. The cell of claim 5, wherein the conductivity type of said fifth field effect transistor is opposite from that of said first and third series transistors.

7. The cell of claim 3, wherein said first and second cross-coupled inverters each comprise a field-effect driver transistor and a load device;

and wherein said isolation circuit comprises:

a fifth field-effect transistor having its source-to-drain path coupled between the source of the driver transistor of said first cross-coupled inverter and said first power supply node; and a sixth field-effect transistor having its source-to-drain path coupled between the source of the driver transistor of said second cross-coupled inverter and said first power supply node;

wherein said fifth and sixth field effect transistors have their gates coupled together as said control terminal of said isolation circuit.

8. The cell of claim 7, wherein the gates of said fifth and sixth field-effect transistors receive said transfer enable signal in such a manner that said transfer enable signal turns off said fifth and sixth field-effect transistors and turns on said first and third series transistors in said first transfer circuit.

9. The cell of claim 8, wherein the conductivity type of said fifth and sixth field-effect transistors is opposite from that of said first and third series transistors.

10. The cell of claim 1, wherein said second memory cell further comprises:

an isolation circuit, having a conduction path coupled between said first and second cross-coupled inverters of said second memory cell and said first power supply node, and having a control terminal;

and further comprising:

a second transfer circuit, comprising:

a third series circuit coupled between the first data node of said second memory cell and said second power supply node, having a control terminal for receiving a second transfer enable signal enabling said second series circuit to couple said second power supply node to said first data node of said second memory cell, responsive to the data state of said first memory cell; and a fourth series circuit coupled between the second data node of said second memory cell and said second power supply node, having a control terminal for receiving a second transfer enable signal enabling said fourth series circuit to couple said second power supply node to said second data node of said second memory cell, responsive to the data state of said first memory cell;

wherein said control terminal of said isolation circuit of said second memory cell is controlled in such a manner as to isolate said first and second cross-coupled inverters of said second memory cell from said first power supply node during a portion of the time that said second transfer enable signal enables said third and fourth series circuits.

11. A method of transferring data from a first memory cell to a second memory cell in a dual storage cell, said second memory cells comprising first and second cross-coupled inverters biased between first and second power supply nodes, and having first and second data nodes, comprising the steps of:

disconnecting said first and second cross-coupled inverters from being biased by said second power supply node;

writing data to said second memory cell according to the contents of said first memory cell, comprising the steps of:

coupling said first data node to said first power supply node responsive to said first memory cell storing a first data state; and coupling said second data node to said first power supply node responsive to said first memory cell storing a second data state; and after said writing step, connecting said first and second cross-coupled inverters to be biased by said second power supply node.

12. The method of claim 11, further comprising:

receiving a first transfer enable signal, indicating that a transfer of data from said first memory cell to said second memory cell is to be performed;

and wherein said writing step is performed responsive to said first transfer enable signal.

13. The method of claim 12, wherein said disconnecting step is performed responsive to said first transfer enable step.

14. The method of claim 13, wherein said connecting step is performed responsive to receiving the end of said first transfer enable signal.

15. The method of claim 11, wherein said first and second cross-coupled inverters each comprise a field-effect driver transistor and a load device;

wherein said disconnecting step comprises:
turning off an isolation transistor coupled in series between the sources of said driver transistors of said first and second inverters and said second power supply node;

and wherein said connecting step comprises:
turning on said isolation transistor.

16. The method of claim 15, wherein said dual storage cell further comprises first and second series field-effect transistors having their source-drain paths connected in series between said first power supply node and said first data node of said second memory cell, and third and fourth series field-effect transistors having their source-drain paths connected in series between said first power supply node and said second data node of said second memory cell;

wherein said second memory cell further comprises first and second complementary data nodes, said first data node of said first memory cell being coupled to the gate of said second series transistor, and said second data node of said first memory cell being coupled to the gate of said fourth series transistor;

and wherein said writing step comprises biasing the gates of said first and third series transistors into the on-state.

17. The method of claim 16, wherein said isolation transistor is of the opposite conductivity type of said first and third series transistors;

and wherein the gate of said isolation transistor is connected to the gates of said first and third series transistors 18. The method of claim 11, wherein said first and second cross-coupled inverters each comprise a field-effect driver transistor and a load device;

wherein said disconnecting step comprises:
biasing the gates of first and second isolation transistors into the off-state, said first and second isolation transistors having their source-to-drain paths coupled between the source of said driver transistor in said first and second cross-coupled inverters, respectively, and said second power supply node;

and wherein said connecting step comprises:
biasing the gates of said first and second isolation transistors into the on-state.

19. The method of claim 18, wherein said dual storage cell further comprises first and second series field-effect transistors having their source-drain paths connected in series between said first power supply node and said first data node of said second memory cell, and third and fourth series field-effect transistors having their source-drain paths connected in series between said first power supply node and said second data node of said second memory cell;

wherein said second memory cell further comprises first and second complementary data nodes, said first data node of said first memory cell being coupled to the gate of said second series transistor, and said second data node of said first memory cell being coupled to the gate of said fourth series transistor;

and wherein said writing step comprises biasing the gates of said first and third series transistors into the on-state.

20. The method of claim 19, wherein said first and second isolation transistors are of the opposite conductivity type of said first and third series transistors;

and wherein the gates of said first and second isolation transistors are connected to the gates of said first and third series transistors.

* * * * *